(12) United States Patent
Kamran et al.

(10) Patent No.: US 10,840,941 B1
(45) Date of Patent: Nov. 17, 2020

(54) SYSTEM AND METHOD FOR IMPROVING MATCHING IN A SIGNAL CONVERTER

(71) Applicant: NXP B.V., Eindhoven (NL)

(72) Inventors: Muhammad Kamran, Helmond (NL); Harry Neuteboom, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/735,031

(22) Filed: Jan. 6, 2020

(51) Int. Cl.
  *H03M 3/00* (2006.01)
  *H03M 1/76* (2006.01)
  *H03M 1/18* (2006.01)
  *H03M 1/12* (2006.01)
  *H03M 1/06* (2006.01)
  *H03M 1/78* (2006.01)

(52) U.S. Cl.
  CPC ......... *H03M 3/464* (2013.01); *H03M 1/0663* (2013.01); *H03M 1/1255* (2013.01); *H03M 1/182* (2013.01); *H03M 1/765* (2013.01); *H03M 1/785* (2013.01); *H03M 3/502* (2013.01)

(58) Field of Classification Search
  CPC ...... H03M 3/464; H03M 1/785; H03M 3/502; H03M 1/0663; H03M 1/182; H03M 1/765; H03M 1/1255

USPC .......................................... 341/143–145, 154
  See application file for complete search history.

(56) References Cited

U.S. PATENT DOCUMENTS

| | | | |
|---|---|---|---|
| 6,037,889 A * | 3/2000 | Knee | H03M 1/0612 341/144 |
| 6,249,239 B1 * | 6/2001 | Corkum | H03M 1/0663 341/144 |
| 6,611,221 B1 | 8/2003 | Soundarapandian et al. | |
| 7,576,671 B2 | 8/2009 | Petilli et al. | |
| 10,014,873 B1 | 7/2018 | van Veldhoven et al. | |

* cited by examiner

*Primary Examiner* — Khai M Nguyen

(57) ABSTRACT

A signal converter includes a first converter, a second converter, a signal generator, and a controller. The first converter generates a first analog signal from a digital signal, and the second converter generates a second analog signal from the digital signal. The signal generator outputs a converted analog signal based on the first analog signal and the second analog signal. The controller generates one or more control signals to change a power supply state of at least one of the first converter and the second converter. The change in power supply state suppress even order harmonics.

20 Claims, 10 Drawing Sheets

SYSTEM AND METHOD FOR IMPROVING MATCHING IN A SIGNAL CONVERTER

Example embodiments disclosed herein generally relate to controlling the conversion of signals between different domains.

BACKGROUND

Many circuit applications require signal conversions to be performed between the digital and analog domains. These conversions are often performed using a sigma-delta modulator. A sigma-delta modulator may be used, for example, to convert an analog input signal to high resolution digital signal. These operations are useful in performing clock-generation and filtering operations in communications systems However, the analog to digital conversions performed in existing sigma-delta modulators introduce significant distortion that have an adverse effect on operation of the host circuit. The noise is mainly attributable to mismatch that occurs in the output of a digital-to-analog converter located in a feedback loop of the modulator. The mismatch introduces n-th order harmonics, transients, or other forms of spurious signals into the converter output that degrades performance.

Various attempts have been made to control the distortion in sigma-delta converters. One attempt involves using data-weighted-averaging (DWA) algorithms to perform noise shaping. However, DWA algorithms have been shown to introduce noise. Other attempts involve the use of an excessive number of extra switches, amplifiers, and/or other circuit components that also introduce noise, increase power consumption, and in some cases also require matching to be performed. While these effects occur in sigma-delta converters, they occur in other types of converters and circuits where signal conversions are performed that produce distortion from mismatch and other sources.

SUMMARY

In accordance with one or more embodiments, a signal converter includes a first converter configured to generate a first analog signal from a digital signal; a second converter configured to generate a second analog signal from the digital signal; a signal generator configured to output a converted analog signal based on the first analog signal and the second analog signal; and a controller configured to generate one or more control signals to change a power supply state of at least one of the first converter and the second converter, the change in power supply state to suppress harmonics in the converted analog signal. The one or more control signals may flip the power supply state of at least one of the first converter and the second converter in order to suppress generation of the harmonics. The one or more control signals may change the power supply states of the first and second converters in different periods.

The signal generator may include a selector coupled between the output node and the first and second converters, wherein the controller is to generate one or more third control signals to control selection states of the selector in synchronism with the changed power supply states of the first converter and the second converter in the different periods. The converter may be selected and the second converter is not selected in a first selection state, and the first converter is not selected and the second converter may be selected in a second selection state. The one or more control signals may flip the power supply state of the second converter in the first selection state and flip the power supply state of the first converter in the second selection state.

The first signal converter may include a first resistor ladder and the second signal converter may include a second resistor ladder. The controller may be configured to compare an amplitude of the digital signal with a predetermined value, and generate the one or more control signals to change the power supply state of at least one of the first converter and the second converter based on a result of the comparison. The signal generator may output the converted analog signal when the amplitude of the digital signal is greater than the predetermined value. The predetermined value may be based on a predetermined proportion between suppression of distortion and harmonics in the converted analog signal.

In accordance with one or more embodiments, a signal conversion method includes generating a first analog signal from a digital signal; generating a second analog signal from the digital signal; outputting a converted analog signal based on the first and second analog signals; and controlling generation of one or more control signals to change a power supply state of at least one of the first converter and the second converter in order to suppress harmonics in the converted analog signal. The one or more control signals may flip the power supply state of at least one of the first converter and the second converter in order to suppress generation of the harmonics. The one or more control signals may change the power supply states of the first and second converters in different periods.

Outputting the converted analog signal may include generating one or more third control signals to control selection states of a selector coupled between the output node and the first and second converters, the selection states controlled in synchronism with the changed power supply states of the first converter and the second converter in the different periods. The first analog signal may be generated by a first converter and the second analog signal may be generated by a second converter. The first converter may be selected and the second converter may not be selected in a first selection state, and the first converter may not be selected and the second converter may be selected in a second selection state.

The one or more control signals may flip the power supply state of the second converter in the first selection state and flip the power supply state of the first converter in the second selection state. The method may include comparing an amplitude of the digital signal with a predetermined value, and generating the one or more control signals to change the power supply state of at least one of the first converter and the second converter based on a result of the comparison. Output the converted analog signal may be performed when the amplitude of the digital signal is greater than the predetermined value. The predetermined value may be based on a predetermined proportion between suppression of distortion and harmonics in the converted analog signal.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
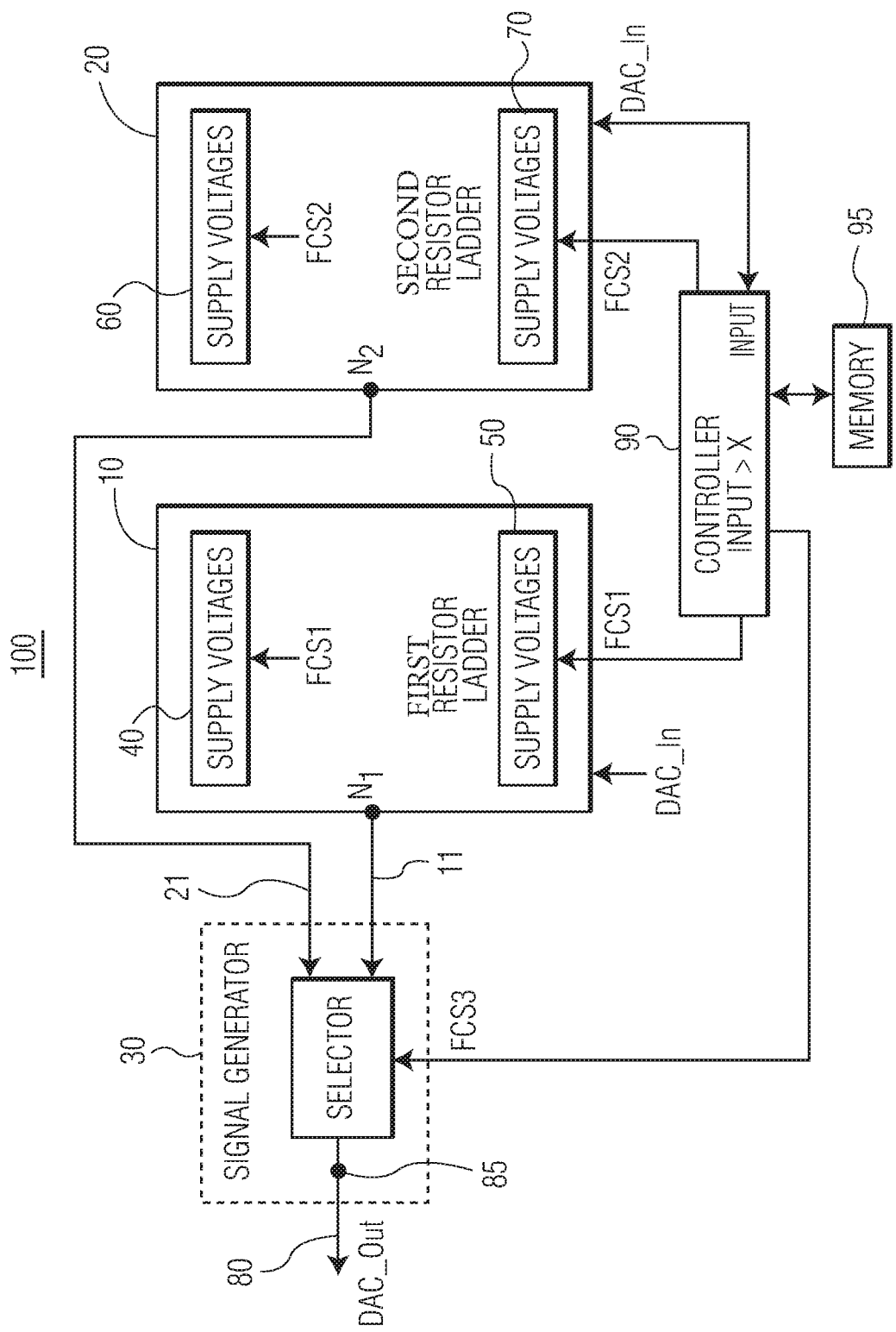
FIG. 1 illustrates an embodiment of a signal converter.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

FIG. 1 illustrates an embodiment of a signal converter 100 for generating a converted signal with DAC and impedance matching when fed back or otherwise input into a host circuit. In one example application, the signal converter may be included in a feedback path of a sigma-delta modulator serving as the host circuit. Embodiments directed to such an application are discussed below. However, the signal converter may be applied to other types of host circuits, which including flash analog-to-digital converters or other types of host circuit which require a signal conversion operation to be performed.

Referring to FIG. 1, the signal converter includes a first resistor ladder 10, a second resistor ladder 20, and a signal generator 30. The first resistor ladder 10 includes one or more resistors with predetermined resistance values that are coupled to one another in series and to the same output node N1 in parallel. The resistance values may be the same or different from one another, depending, for example, on the intended application and/or the range of amplitudes of the analog signals to be generated. The resistors in the first resistor ladder may correspond to each value of an M-bit input signal 5 (not mentioned in the diagram), illustratively shown as DAC_In. For example, for an M-bit input signal 5, the first resistor ladder may include $N=2^M$ resistors coupled in series.

The first resistor ladder 10 generates an analog signal from the digital input by coupling ends of the ladder to at least one of a first set of supply voltages 40 and at least one of a second set of supply voltages 50, and then selectively connecting the resistors in the ladder based on the individual bit values of the M-bit input signal. In one embodiment, the first set of supply voltages 40 may include a first supply voltage and a second supply voltage. The first supply voltage may have a relatively high predetermined value and the second supply voltage may have a relatively low predetermined value. For example, the first supply voltage may represent an upper limit of the range of amplitudes of the analog signal to be generated and the second supply voltage may represent a lower limit (e.g., ground or some other reference value) of the range of amplitudes of the analog signal. The second set of supply voltages 50 may include a third supply voltage and a fourth supply voltage. In one embodiment, the third and fourth supply voltages may respectively correspond to the first and second supply voltages in the first set of supply voltages 40.

The selective connection of the resistors may be accomplished, for example, by coupling a corresponding switch between each resistor and an output terminal of the ladder. For example, a bit having a logical one value may close the switch and a bit having a logical zero value may open the switch. In another embodiment, the opposite may be true—a logical zero may close the switch and a logical one may open the switch. Thus, input signals having different bit values will cause different combinations of the resistors in the first resistor ladder to be selectively connected, thereby generating a first analog signal 11 with an amplitude based on the digital input signal.

In order to generate the analog signal at output node N1, first, different combinations of the supply voltages in the first set of supply voltages 40 and the second set of supply voltages 50 are connected to the resistor ladder. For example, when the first supply voltage in the first set 40 with a relatively high value is connected to a first end of the resistor ladder, the fourth supply voltage in the second set 50 with a relatively low value is connected to a second end of the resistor ladder. Conversely, when the second supply voltage in the first set 40 with a relatively low value is connected to the first end of the resistor ladder, the third supply voltage in the second set 50 with a relatively high value is connected to the second end of the resistor ladder. Thus, opposing ends of the ladder are connected to different supply values, but the connection arrangement of the supply voltages may be flipped in accordance with one or more embodiments to achieve DAC and resistance matching.

The second resistor ladder 20 may be constructed in a manner similar to the first resistor ladder. For example, in one embodiment the second resistor ladder may have the same number of resistors as the first resistor ladder and may be connected to its output node N2 through a corresponding number of switches. Because the second resistor ladder also receives the digital input signal 5 (not mentioned in the diagram), the resistors in the second resistor ladder may be selectively connected, through the switches, to the output node N2 based on the same bit values.

In addition to these features, the second ladder includes (or is coupled to) a third set of supply voltages 60 and a fourth set of supply voltages 70. In one embodiment, the third set of supply voltages may include the same supply voltages (e.g., the first and second supply voltages) as in the first set of supply voltages 40, and the fourth set of supply voltages may include the same supply voltages (e.g., the third and fourth supply voltages) as the second set of supply voltages. Also, in one embodiment, the resistors in the second resistor ladder 20 may have the same resistance values as corresponding ones of the resistors in the first resistor ladder 10. Also, the first voltage value and the second voltage value connected to the first resistance ladder may also be connected to the second resistance ladder. Through connections of the supply voltages in the third and fourth sets and the selective connection of the resistor switches, the second resistor ladder generates a second analog signal 21 at node N2.

Thus, in one embodiment, the second resistor ladder may generate an analog signal having the same amplitude as the analog signal generated by the first resistor ladder. Moreover, the waveform of the analog signal generated by the second resistor ladder may be the same or different from the waveform of the analog signal generated by the first resistor ladder. (The waveform is same it is not reversed)

A controller 90 generates three control signals for controlling operation of the signal converter. The first set of control signals FCS1 controls the connection arrangement of the supply voltages, in the first and second sets of supply voltages 40 and 50, to respective ends of the first resistor ladder. The first set of control signals FCS1 may include a single signal used to control connection of different ones of the supply voltages in the first and second sets 40 and 50 (e.g., through use of appropriate intervening logic) or may include a plurality of switch signals for controlling the connection state of corresponding ones of the supply voltages in these sets.

The second set of control signals FCS2 controls the connection arrangement of the supply voltages, in the third and fourth sets of supply voltages 60 and 70, to respective ends of the second resistor ladder. The second set of control signals FCS2 may include a single signal used to control connection of different ones of the supply voltages in the third and fourth sets 60 and 70 (e.g., through use of appropriate intervening logic) or may include a plurality of switch signals for controlling the connection state of corresponding ones of the supply voltages in these sets.

The third set of control signals FCS3 controls operation of the selector 30. In one embodiment, the selector 30 may selectively connect either one or both of the first and second analog signals 11 and 21 output from the resistor ladders, in order to generate the converted digital output signal 80 DAC_Out of the signal converter. The third set of control signals FCS3 may be a single control signal for controlling selection of one or both of the first and second analog signals 11 and 21 (with or without intervening logic), or may include multiple signals for controlling the connection state of individual ones of the first and second analog signals to generate the digital output signal 80. In one embodiment, the third set of control signals FCS3 is synchronized or otherwise coordinated with the first and second sets of control signals FCS1 and FCS2 based on a flipping method for purposes of achieving DAC and resistor matching (or otherwise reducing distortion) in the host circuit.

In one embodiment, the controller 90 executes instructions stored in a memory 95 in order to generate the flip control signals and/or to perform other operations of the signal converter. The memory may be any type of non-transitory computer-readable medium, and the instructions stored in that medium may cause the controller to perform the operations of the embodiments described herein. The controller may be a processor or other type of computing device, examples of which are described in greater detail below.

Figure 2:
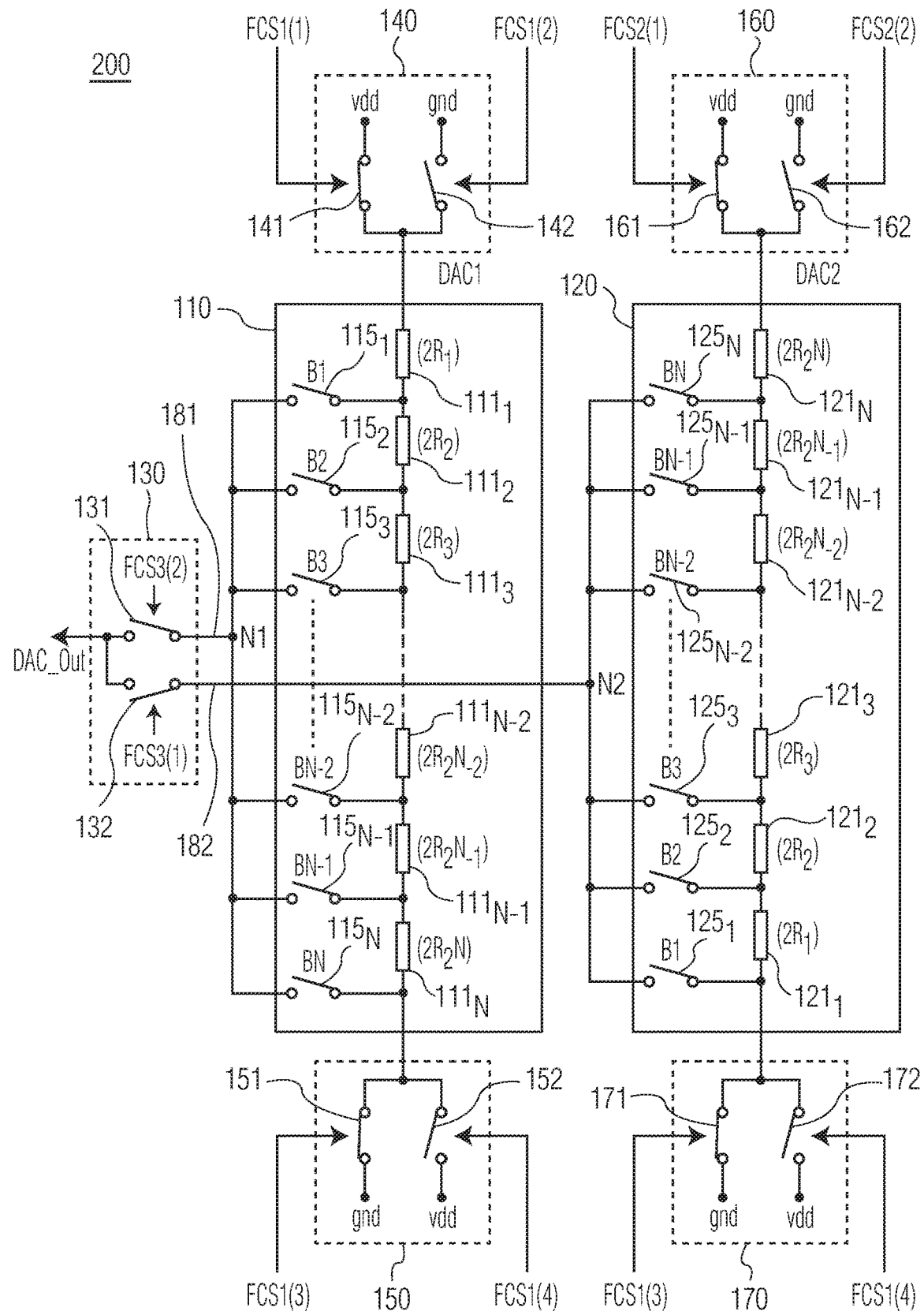
FIG. 2 illustrates an embodiment of a signal converter.

FIG. 2 illustrates an embodiment of a signal converter that may be considered to be a more specific example (but not the only) implementation of the embodiment of FIG. 1. The signal converter of FIG. 1 may be implemented in a different manner than shown in FIG. 2 in other embodiments.

Referring to FIG. 2, the signal converter 200 includes a first resistor ladder 110, a second resistor ladder 120, and a signal generator 130. The first resistor ladder 110 may also be referred to as a first digital-to-analog converter (DAC1), and the second resistor ladder 120 may also be referred to as a second digital-to-analog converter (DAC2). Together, the first and second digital-to-analog converters may be considered to form a signal converter that improves the signal-to-noise and distortion ratio of a host circuit which receives the converted analog signal output.

The first resistor ladder 110 includes a plurality of first resistors $111_1$ to $111_N$ coupled in series between a first switching circuit 140 and a second switching circuit 150. Each of the resistors in the first ladder are coupled to an output node N1 through a corresponding number of switches $115_1$ to $115_N$. In this embodiment, the resistors in the first resistor ladder have resistance values $2R_1$ to $2R_{2N}$ which may be the same or different values, depending, for example, on the quantization performed to generate the digital input signal.

In operation, the first resistor ladder 110 generates a first analog signal 181 at node N1 based on the states of the switches $115_1$ to $115_N$ and the states of the first switching circuit 140 and the second switching circuit 150. The states of the switches $115_1$ to $115_N$ are controlled based on the logical bit values of the digital input signal. For example, as previously described, the logical value of each bit of the input digital signal controls the state of a corresponding one of the switches, e.g., a logical 1 value may close the switch and a logical 0 value may open the switch. Thus, a M-bit input digital signal is decoded and connected to bits B1, B2, B3, . . . , BN-2, BN-1, BN, the first bit B1 controls the state of switch $115_1$, the second bit B2 controls the state of switch $115_2$, . . . , and the last bit BN controls the state of switch $115_N$.

The first switching circuit 140 includes a first switch 141 and a second switch 142 coupled to a first supply voltage and a second supply voltage, respectively. In this embodiment, the first supply voltage is a high voltage (vdd) and the second supply voltage is a low voltage (gnd). The state of the first switch 141 may be controlled based on a first control signal FCS1(1) in a first set of flip control signals FCS1 output from a controller, which, for example, may correspond to controller 90 in FIG. 1. The state of the second switch 142 may be controlled based on a second control signal FCS1(2) in the first set of flip control signals from the controller. The control signals FCS1(1) and FCS1(2) may control the first and second switches to be in alternating states.

The second switching circuit 150 includes a third switch 151 and a fourth switch 152 coupled to a third supply voltage and a fourth supply voltage, respectively. In this embodiment, the third supply voltage is the low voltage (gnd) and the fourth supply voltage is the high voltage (vdd). The state of the third switch 151 may be controlled based on a third control signal FCS1(3) in the first set of flip control signals FCS1 output from a controller, and the state of the fourth switch 152 may be controlled based on a fourth control signal FCS1(4) in the first set of flip control signals. The control signals FCS1(3) and FCS1(4) may control the third and fourth switches to be in alternating states.

Moreover, in one embodiment, the first set of flip control signals are generated by the controller so that the first and second switching circuits 140 and 150 connect respective ends of the first resistor ladder to different supply voltages throughout a predetermined cycle of operation, to be discussed in greater detail below. For example, when the first switching circuit 140 connects the high supply voltage (vdd) to a first end of the first resistor ladder, the second switching circuit 150 connects the low supply voltage (gnd) to a second end of the first resistor ladder, and vice versa.

The second resistor ladder 120 includes a plurality of second resistors $121_1$ to $121_N$ coupled in series between a third switching circuit 160 and a fourth switching circuit 170. Each of the resistors in the second ladder are coupled to an output node N2 through a corresponding number of switches $125_1$ to $125_N$. In this embodiment, the resistors in second ladder 120 have the same resistance values $2R_1$ to $2R_{2N}$, as the resistors in the first ladder 110, however the resistors in the second ladder are arranged in a different order, e.g., the resistors $121_1$ to $121_N$ are arranged in a reverse order relative to the resistors in the first ladder. In another embodiment, one or more of the second resistors in the second ladder may have resistance values different from the resistance values of one or more of the first resistors in the first ladder as a result of mismatch between ladder.

In operation, the second resistor ladder 120 generates a second analog signal 182 at node N2 based on the states of the switches $125_1$ to $125_N$ and the states of the third switching circuit 160 and the fourth switching circuit 170. The states of the switches $125_1$ to $125_N$ are controlled based on the logical bit values of the digital input signal, with the bit values of the input signal being applied in reverse order in order to correspond to the reverse order arrangement of the second resistors. Thus, for example, bit value B1 is applied control the state of switch $125_1$ to selectively connect second resistor $2R_1$, arranged at the second end of the second ladder.

The third switching circuit 160 includes a first switch 161 and a second switch 162 coupled to the first supply voltage (vdd) and the second supply voltage (gnd), respectively. The state of the first switch 161 may be controlled based on a first control signal FCS2(1) in a second set of flip control signals FCS2 output from the controller. The state of the second switch 162 may be controlled based on a second control signal FCS2(2) in the second set of flip control signals from the controller. The control signals FCS2(1) and FCS2(2) may control the first and second switches 161 and 162 to be in alternating states.

The fourth switching circuit 170 includes a third switch 171 and a fourth switch 172 coupled to the third supply voltage (gnd) and fourth supply voltage (vdd), respectively. The state of the third switch 171 may be controlled based on a third control signal FCS2(3) in the second set of flip control signals FCS2 output from a controller, and the state of the fourth switch 172 may be controlled based on a fourth control signal FCS2(4) in the second set of flip control signals. The control signals FCS2(3) and FCS2(4) may control the third and fourth switches to be in alternating states. While the supply voltages in this embodiment are described as corresponding to gnd and vdd, the supply voltages may be positive and negative voltages in another embodiment.

Moreover, in one embodiment, the second set of flip control signals are generated by the controller so that the third and fourth switching circuits 160 and 170 connect respective ends of the second resistor ladder to different supply voltages throughout a predetermined cycle of operation, to be discussed in greater detail below. For example, when the third switching circuit 160 connects the high supply voltage (vdd) to a first end of the second resistor ladder, the fourth switching circuit 170 connects the low supply voltage (gnd) to a second end of the second resistor ladder, and vice versa.

In some applications, the number of resistors in each resistor ladder may be different from the number of decoded bits in the input digital signal. For example, the number of bits in the input digital signal may be less than the number of resistors in each of the first and second ladders. In order to allow for this case, the default state of the switches 115 and 125 may be in the open state. Because only the bits having a logical one value close corresponding ones of the resistor switches, the signal converter may convert any digital signal up to a maximum of N bits corresponding to the number of resistors in each of the first and second ladders. Thus, for example, if N=5, then the signal converter may just as easily convert a 3-bit input digital signal as a 5-bit input digital signal, without any modification to the ladder resistors because of the one-to-one correspondence of the resistor switches and the default open state of these switches.

The signal generator 130 may be an output node, a signal selector, or another type of circuit or logic that generates the converted analog signal based in one or more of the analog signals output from the first and second resistor ladders. In one embodiment, the signal generator 130 includes a first switch 131 and a second switch 132 connected in parallel. The first switch 131 is coupled to the output node N1 of the first resistor ladder 110 to receive the first analog signal 181. The second switch 132 is coupled to the output node N2 of the second resistor ladder 120 to receive the second analog signal 182. The switches 131 and 132 are controlled by a third set of flip control signals FCS3(2) and FCS3(1) generated by the controller, in synchronism with the first and second sets of flip control signals.

Figure 3:
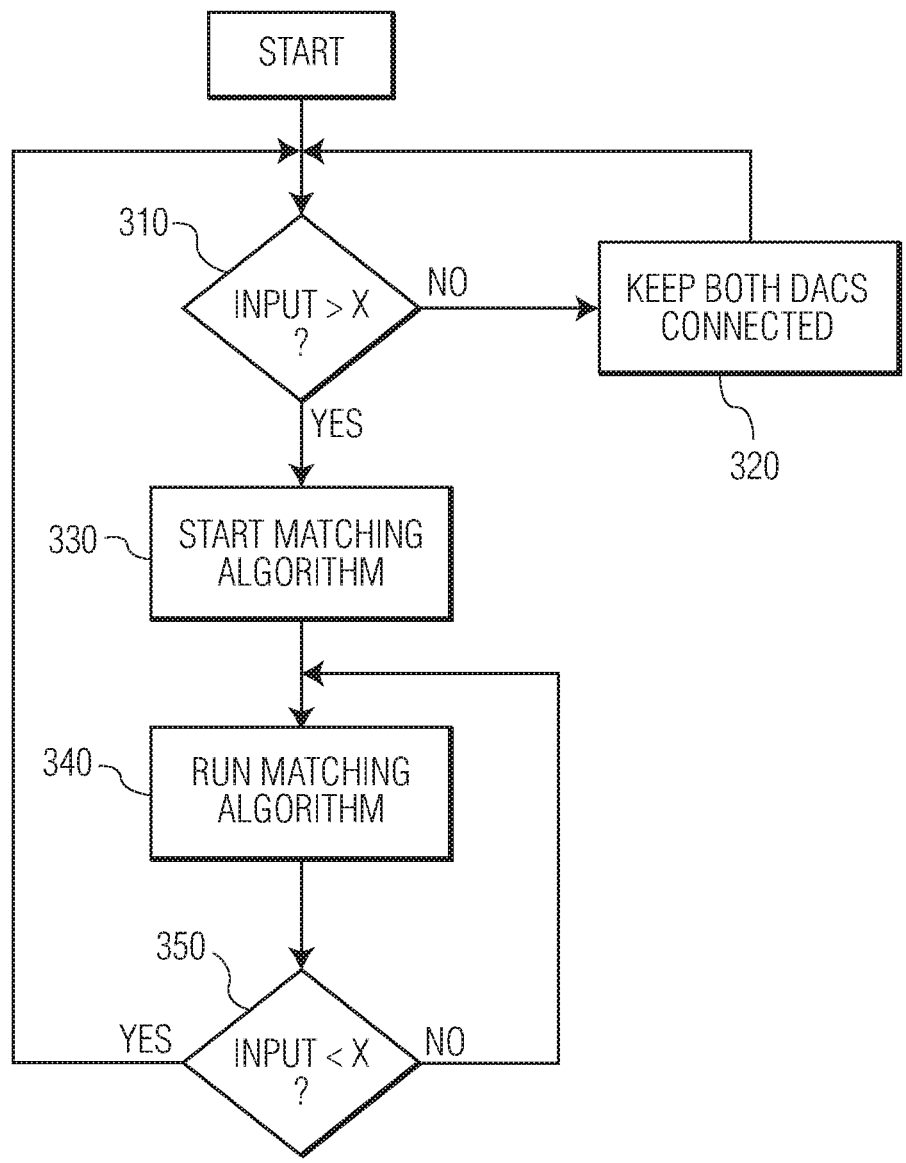
FIG. 3 illustrates an embodiment of a method for performing signal conversion.

FIG. 3 illustrates an embodiment of a method for controlling a signal converter, for example, as shown in FIG. 1 or FIG. 2. For purposes of illustration, the method will be described relative to the signal converter of FIG. 2.

In this embodiment, a DAC matching algorithm is initiated and controlled based on one or more operating conditions, at least some of which are based on the size of the input digital signal received from a host circuit. The size of the input digital signal may cause the method to address different countervailing concerns. For example, noise may be the predominant concern with input digital signals that are relatively small. Conversely, distortion may be the predominant concern with input digital signals that are relatively large. The method may be implemented in a manner that trades off (or balances) noise versus distortion for different sizes (e.g., amplitudes) of input digital signals.

For example, for input digital signals that are relatively small in size, the method may generate the flip control signals to connect both resistor ladders in order to generate the output analog signal DAC_Out. Connecting both ladders has the effect of reducing resistance and, proportionally, the noise that would otherwise be generated if the method were not performed. For input digital signals that are relatively large in size, the method may generate the flip control signals in accordance with a flip DAC matching algorithm, which reduces distortion by avoiding any transient effects in the output analog signal DAC_Out.

Referring to FIG. 3, the method includes, at 310, comparing the size (e.g., magnitude or amplitude) of the input digital signal to a predetermined value. The predetermined value may be indicative of, for example, a certain amplitude of the analog signal to which the input digital signal corresponds. As indicated above, for some applications, distortion may be favored over impedance considerations when the input digital signal has a corresponding large amplitude (e.g., greater than predetermined value X). Conversely, reducing impedance may take precedence over distortion for an input digital signal having a correspondingly small amplitude (e.g., less than or equal to the predetermined value X).

At 320, when the magnitude of the input digital signal is less than the predetermined value X, the matching algorithm is not started. Instead, the controller generates the third set of flip control signals to cause the selector 130 to connect the first and second analog signals 181 and 182 to the output node of the signal converter. This may be accomplished, for example, by generating the flip control signals FSC3(1) and FCS3(2) to values that close both switches 131 and 132. In this case, the output analog signal DAC_Out is generated based on the analog signals output from both of the first and second resistor ladders 110 and 120.

In one embodiment, the predetermined value X may be a value based on a certain proportional relationship between distortion and noise. For example, the value X may indicate a level where the effects caused by distortion is greater than the effects cause by noise in the host circuit. In one embodiment, the value X may be determined to correspond to a level where distortion begins to dominate the noise produced in the host circuit as a result of the conversion. In some cases, some hysteresis may be built into the value of X. This may be performed, for example, in order to prevent the matching algorithm from being switched on and off without stopping when the analog output equals the value of X. Operation 310 may then be repeated for the next input digital signal. Because the ladders are connected parallel, the amplitude generated at the output node corresponds to the amplitude of either one of the resistor ladder outputs, e.g., the outputs of the individual resistor ladders are not added together.

At 330, when the magnitude of the input digital signal is less than the predetermined value X, this may indicate that the effect of noise on the host circuit is greater than distortion or that some other level of proportional difference exists between these two effects. When this occurs, the matching algorithm is started in order to initiate DAC matching that will reduce distortion, for example, by suppressing N-th even order harmonics.

At 340, the matching algorithm is run, for example, by the controller of 90 of the signal converter. Running the matching algorithm may be performed based on a predetermined cycle of operational phases. These phases dictate the different connection states of the supply voltages of the first and second resistor ladders in synchronization with different switching states of the selector. These states are controlled in order to effect flipping operations that suppress distortion that otherwise might be generated as a result of converting the input digital signal into the output analog signal DAC_Out. In accordance with one embodiment, the flipping operations involve changing, or alternating, the supply voltages connected to respective ends of one or more of the first and second resistor ladders. Once the matching algorithm is performed, the resulting analog signal DAC_Out is output to the host circuit. Examples of the flipping operations performed by the matching algorithm are discussed below.

At 350, the amplitude of the converted digital signal compared in operation 310 is compared again to the predetermined value X. If this amplitude is still greater than the value X, then the matching algorithm is run again for the input digital signal. If the amplitude of the converted digital signal is less than the predetermined value X, then the method returns to perform operation 310 for the next input digital signal. In one embodiment, the controller 90 may include a comparator for comparing the amplitude of the converted digital signal to the predetermined value X.

Figure 4:
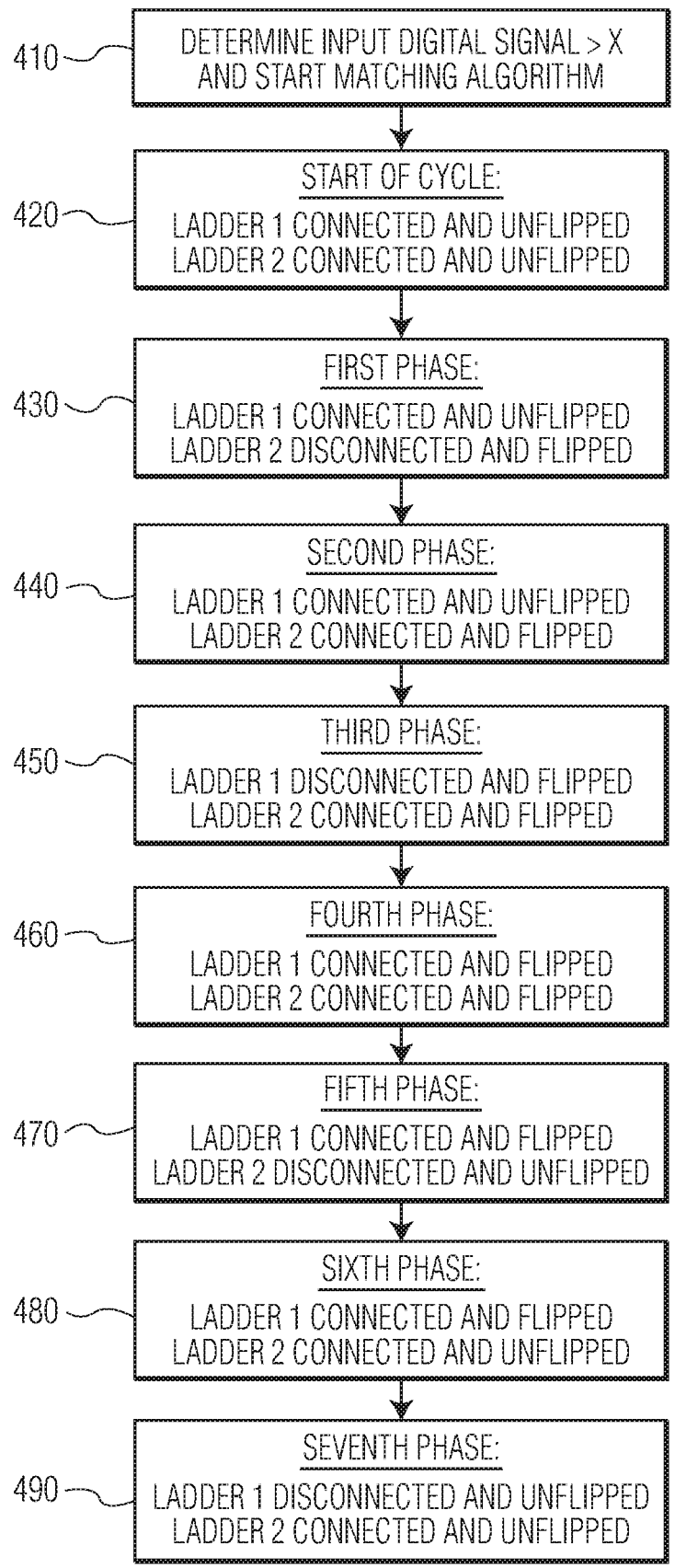
FIG. 4 illustrates an embodiment of a method for performing signal conversion.

FIG. 4 illustrates an embodiment of a method for performing the matching algorithm. This method may be described with reference to FIG. 5, which illustrates an example of a timing diagram for operating the signal converter of FIG. 2 based on the three sets of flip control signals previously described. The timing diagram is arranged according to a plurality of phases of a predetermined cycle implemented to remove distortion (e.g., transients, N-th order harmonics, and other spurious signals) that cause resistance mismatch in the host circuit.

Figure 5:
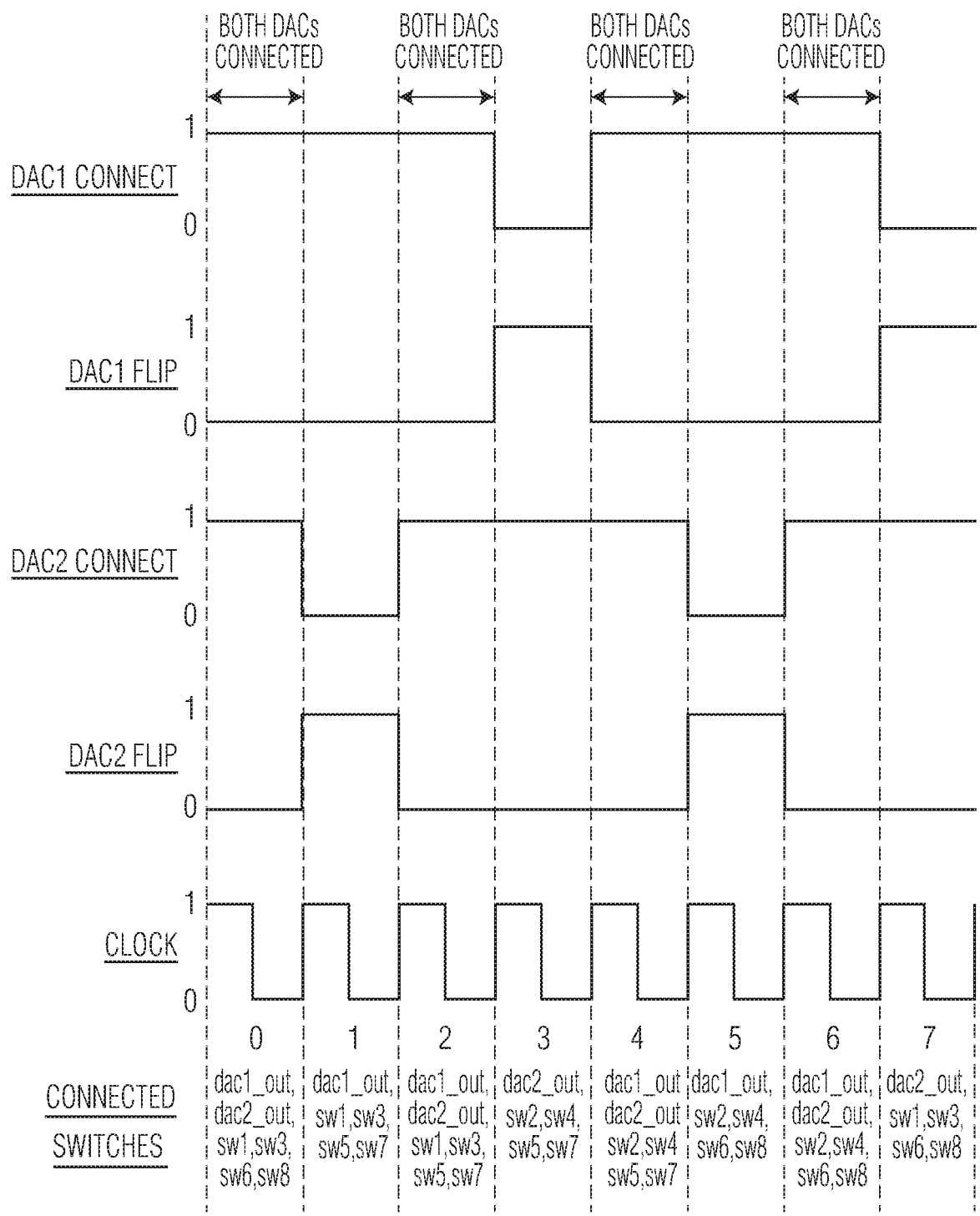
FIG. 5 illustrates an example of a timing diagram for performing signal conversion.

Referring to FIGS. 4 and 5, an initial operation 410 of the method includes determining that the input digital signal is greater than the predetermined value X (operation 310) and then starting the matching algorithm (operation 320). Once the matching algorithm is started, the matching algorithm is run, for example, by controller 90 of the signal converter.

The predetermined cycle used to control the connection states of the supply voltages and switching states of the selector is initiated. These states are controlled relative to a digital clock signal 510 in the timing diagram. The start of the matching algorithm corresponds to clock signal period (0), which occurs before the first phase of the cycle. Clock signal period (0) may also correspond to operation 330 in FIG. 3. In this example, the predetermined cycle includes a plurality of phases for controlling the connection and switching states of the signal converter. In another embodiment, the cycle may have a different number of phases.

At 420, in clock signal period (0), the input digital signal is input into the first and second ladders. The logical one bits close respective ones of the switches. For example, for a three-bit input digital signal with the number of ladder switches are $2^3$, the bit values having a logical one close corresponding switche between $115_1$ to $115_8$ in the first resistor ladder and the remaining switches 115 are left in their default open state. Similarly, the logical-one bit values of the input digital signal close corresponding switche between $125_1$ to $125_8$ in the second resistor ladder and the remaining switches 125 are left in their default open state.

The first set of flipping control signals FSC1 controls connection of the first supply voltage (vdd) to the top end of the first resistor ladder 110 by closing switch (sw1) 141 and the third supply voltage (gnd) to the lower end of the first resistor ladder by closing switch (sw3) 151. The second set of flipping control signals FCS2 controls connection of the first supply voltage (vdd) to the top end of the second resistor ladder 120 by closing switch (sw6) 161 and the third supply voltage (gnd) to the lower end of the second resistor ladder by closing switch (sw8) 171. Thus, the first and second flip control signals connect the same arrangement of supply voltages in both ladders in the unflipped state at the start of the matching algorithm.

The switching states of the selector 130 at the start of the matching algorithm are also shown in FIG. 5. In clock signal period (0), the third set of flip control signals FCS3 controls the selector to select the first and second analog signals output 181 and 182 from both ladders in order to generate an initial state of the output (converted) analog signal DAC_Out. This is accomplished by closing both switches 131 and 132 of the selector in synchronization with the aforementioned connection states of the supply voltages of the first and second ladders. The connection states of the supply voltages and the switching states of the selector are shown in the timing diagram of FIG. 5.

Figure 6A:
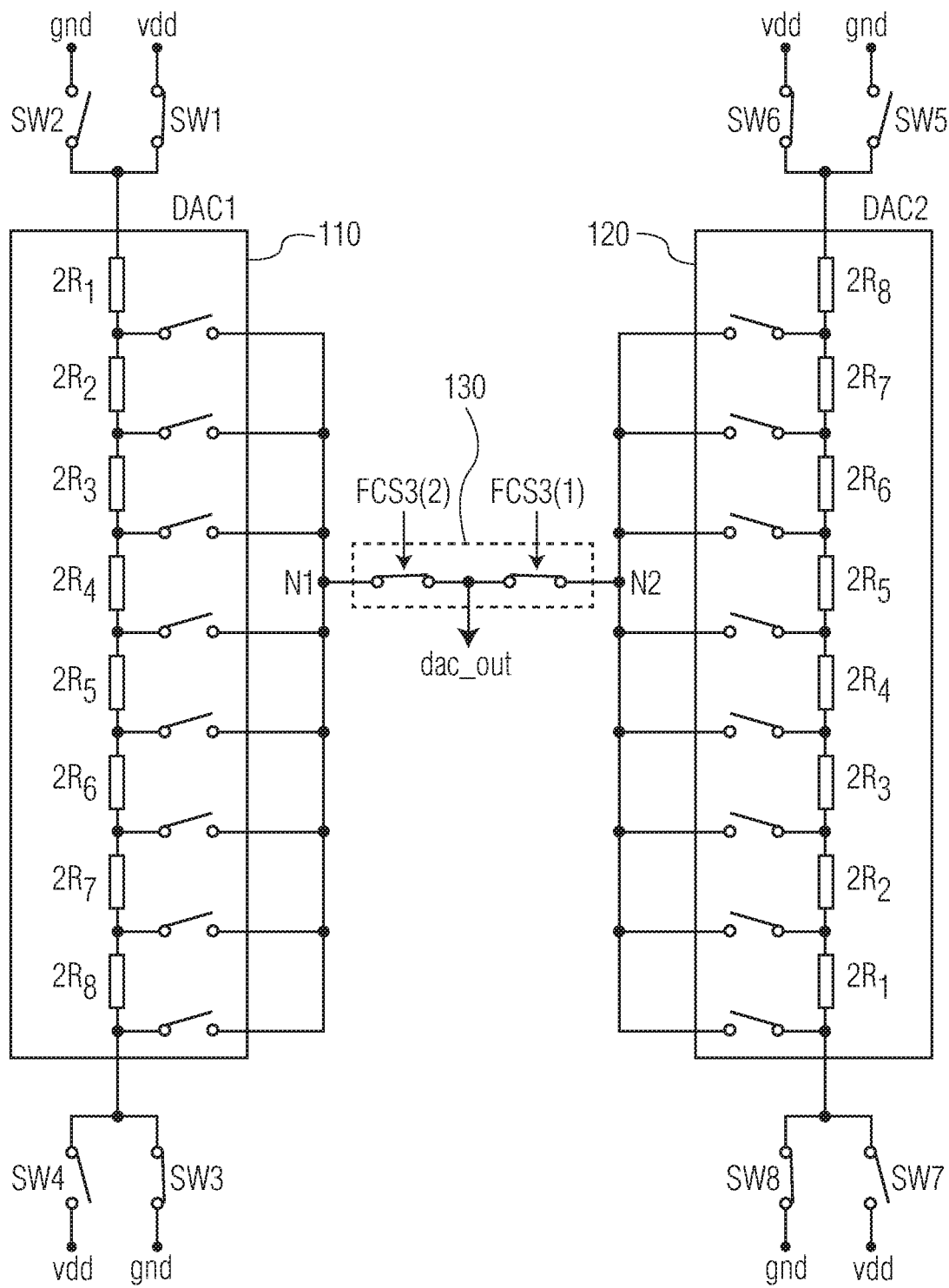
FIGS. 6A to 6D illustrate examples of different states of a signal converter.

For example, in clock signal period (0) of FIG. 5, the first resistor ladder is indicated to be connected (DAC1 connected=1) and in the unflipped state (DAC1 flip=0). Similarly, the second resistor ladder is indicated to be connected (DAC2 connected=1) and in the unflipped state (DAC2 flip=0). An example of a circuit diagram showing the connection and switching states of the signal converter in clock signal period (0) is illustrated in FIG. 6A.

At 430, in clock signal period (1), the first phase of the cycle begins with the switches 115 and 125 still connected as previously described. (These switches may remain connected in the same configuration throughout the cycle.) However, the third flip control signals FCS3 cause the selector to disconnect the second resistor ladder by opening switch 132 and to keep the first resistor ladder connected by maintaining switch 131 in the closed state. Additionally, the first resistor ladder is maintained in the unflipped state by maintaining the values of flip control signals FCS1. However, the values of the flip control signals FCS2 change to place the second resistor ladder in the flipped state relative to its supply voltages.

Figure 6B:
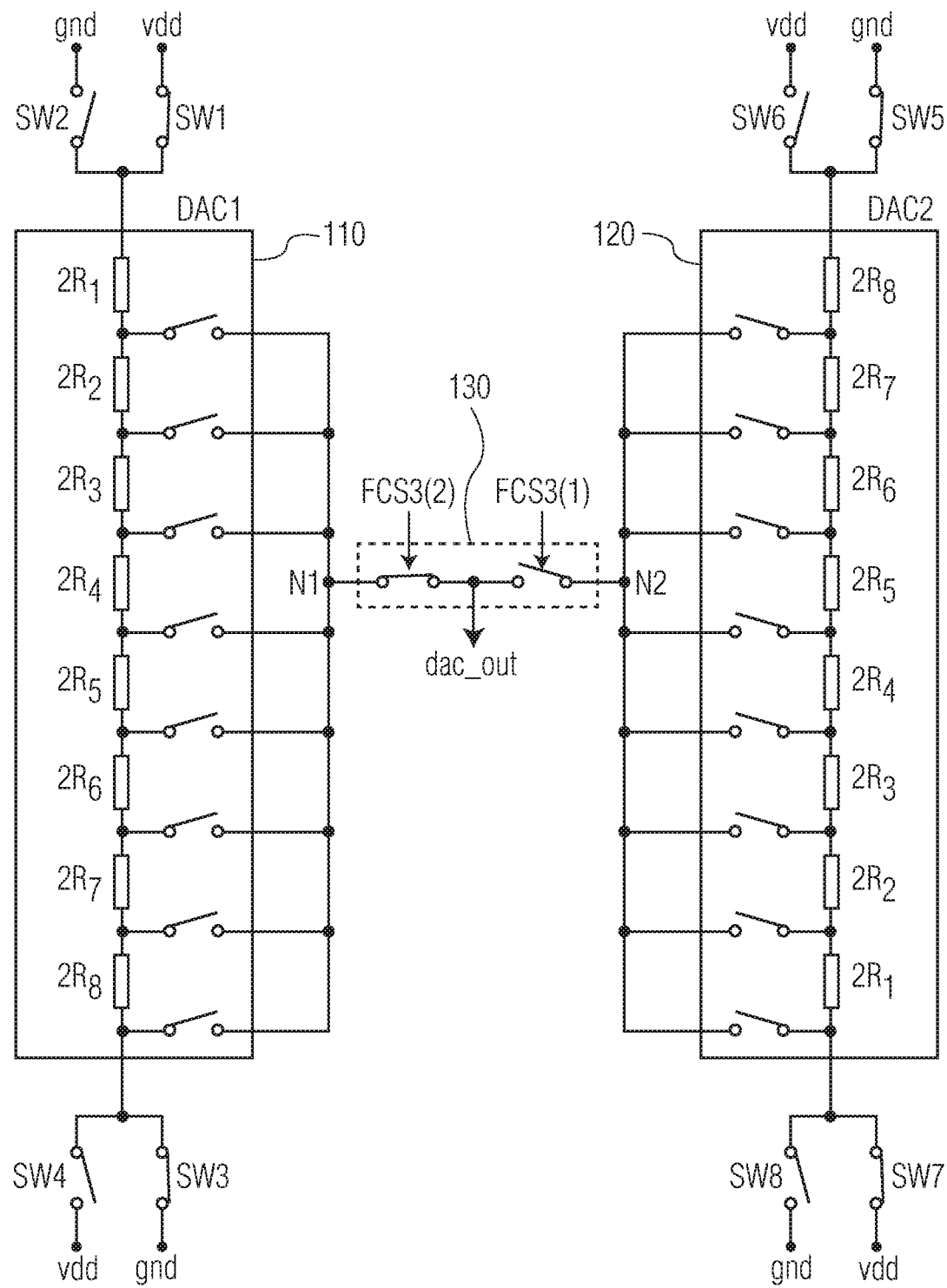

In the timing diagram, the state of the signal converter in the first phase is indicated by DAC1 connect=1, DAC1 flip=0, DAC2 connect=0, and DAC2 flip=1, and the selector and power supply switches that are closed during this clock signal period are indicated as dac1_out (indicating that only the first analog signal from the first ladder is output through the selector), sw1, sw3, sw5, and sw7. Disconnecting and flipping the second resistor ladder while the first resistor ladder is still connected to the output, prevents any spikes from occurring at the output of the signal converter, which, in turn, prevents any degradation in the signal-to-distortion ratio in the host circuit. An example of a circuit diagram showing the connection and switching states of the signal converter in clock signal period (1) is illustrated in FIG. 6B.

At 440, in clock signal period (2), the second phase of the cycle begins with the switches 115 and 125 still connected as previously described. The third flip control signals FCS3 cause the selector to reconnect the second resistor ladder by closing switch 132. Thus, in the second phase that the first and second resistor ladders are connected again. However, the second flip control signals FCS2 maintain the second resistor ladder in the flipped state and the first flip control signals FCS1 maintain the first resistor ladder in the unflipped state. In the timing diagram, this is indicated by DAC1 connect=1, DAC1 flip=0, DAC2 connect=1, and DAC2 flip=0, and the selector and power supply switches that are closed during this clock signal period are indicated as dac1_out, dac2_out, sw1, sw3, sw5, and sw7. (In interpreting the timing diagram, it is to be understood that the connect signals only have a logical one value when asserted. The connect state remains until the connect signals are asserted again, at which time corresponding ones of the ladders assume the complementary state).

At 450, in clock signal period (3), the third phase of the cycle begins with the switches 115 and 125 still connected as previously described. The third flip control signals FCS3 cause the selector to disconnect the first resistor ladder by opening switch 131 and to keep the second resistor ladder connected by maintaining switch 132 in the closed state. Additionally, the switching arrangement of the supply voltages of the first resistor ladder is changed to the flipped state. This is accomplished by generating the first flip control signals FCS1 to close switches 142 and 152 and open switches 141 and 151. The second flip control signals FCS2 maintained the same values as in the second phase (clock signal period (2)).

Figure 6C:
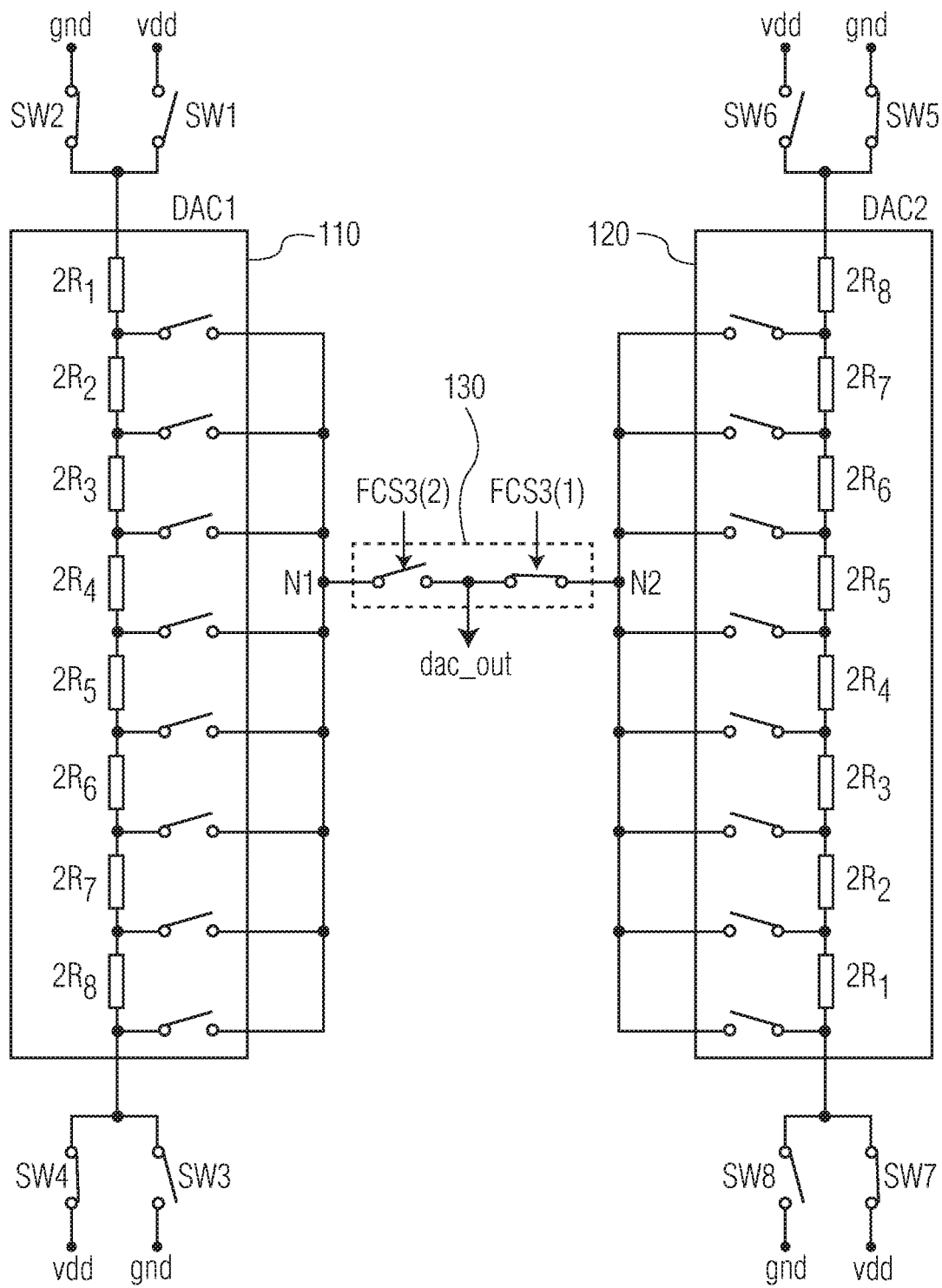

In the timing diagram, the state of the signal converter in the third phase is indicated by DAC1 connect=0, DAC1 flip=1, DAC2 connect=1, and DAC2 flip=0, and the selector and power supply switches that are closed during this clock signal period are indicated as dac2_out (indicating that only the first analog signal from the first ladder is output through the selector), sw2, sw4, sw5, and sw7. Thus, in the third phase, both of the resistor ladders are flipped with only the second ladder being connected to the output node. An example of a circuit diagram showing the connection and switching states of the signal converter in clock signal period (3) is illustrated in FIG. 6C.

At 460, in clock signal period (4), the fourth phase of the cycle begins with the switches 115 and 125 still connected as previously described. The third flip control signals FCS3 cause the selector to reconnect the first resistor ladder by closing switch 131 and to keep the second resistor ladder connected by maintaining switch 132 in the closed state. Thus, both ladders are connected again in the fourth phase. However, the switching arrangements of the supply voltages of the first resistor ladder and the second ladder are both in the flipped state. This is accomplished by generating the first flip control signals FCS1 and the second flip control signals FCS2 to have the same values as in the third phase (clock signal period (3)).

Figure 6D:
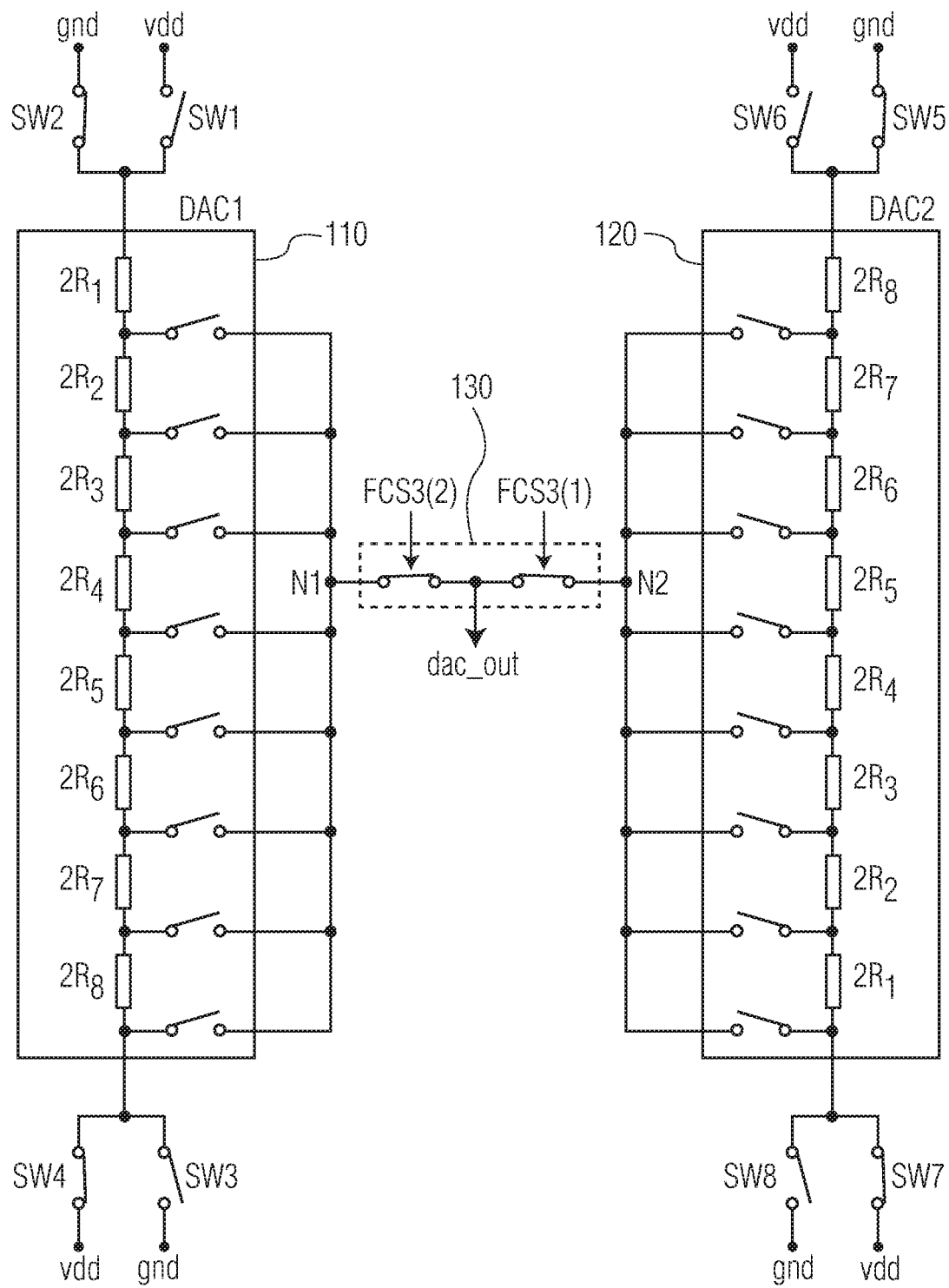

In the timing diagram, the state of the signal converter in the fourth phase is indicated by DAC1 connect=1, DAC1 flip=0, DAC2 connect=1, and DAC2 flip=0, and the selector and power supply switches that are closed during this clock signal period are indicated as dac1_out, dac2_out, sw2, sw4, sw5, and sw7. An example of a circuit diagram showing the connection and switching states of the signal converter in clock signal period (3) is illustrated in FIG. 6D.

At 470, in clock signal period (5), the flip control signals FCS1, FCS2, and FCS3 are generated to disconnect the second resistor ladder and to change the switching state of the second ladder to the unflipped state and to maintain connection of the first resistor ladder in the flipped state. In the timing diagram, the state of the signal converter in clock signal period (5) is indicated by DAC1 connect=1, DAC1 flip=0, DAC2 connect=0, and DAC2 flip=1, and the selector and power supply switches that are closed during this clock period are indicated as dac1_out, sw2, sw4, sw6, and sw8.

At 480, in clock signal period (6), the flip control signals FCS1, FCS2, and FCS3 are generated to connect the first and second resistor ladders and to maintain the switching states of the first and second ladders so that the first resistor ladder is in the flipped state and the second resistor ladder is in the unflipped state. In the timing diagram, the state of the signal converter in clock signal period (6) is indicated by DAC1 connect=1, DAC1 flip=0, DAC2 connect=1, and DAC2 flip=1, and the selector and power supply switches that are closed during this clock period are indicated as dac1_out, dac2_out, sw2, sw4, sw6, and sw8.

At 490, in clock signal period (7), the flip control signals FCS1, FCS2, and FCS3 are generated to disconnect the first resistor ladder and maintain the connection of the second resistor ladder, and to change the switching state of the first resistor ladder to the unflipped state and to maintain the switching state of the second ladder in the unflipped state. In the timing diagram, the state of the signal converter in clock signal period (7) is indicated by DAC1 connect=0, DAC1 flip=1, DAC2 connect=1, and DAC2 flip=0, and the selector and power supply switches that are closed during this clock period are indicated as dac2_out, sw1, sw3, sw6, and sw8.

After the seventh clock signal period, the output analog signal DAC_Out is checked once again against the predetermined value X in operation 350 in FIG. 3. If the output analog signal is still greater than value X, the matching algorithm is performed again over the same cycle for the same input digital signal, starting at clock signal period (0) as previously described. (The algorithm runs at lower clock then input digital signal)

In accordance with the aforementioned embodiments, flipping the supply voltages for the first and second resistor ladders in synchronization with the switching states of the selector reduces or eliminates the transfer of distortion generated by the signal converter to the host circuit. This distortion may be in the form of even order harmonics, transients, and/or other spurious signals. Moreover, the aforementioned embodiments controls the tradeoff between distortion and noise based on various circuit conditions (including but not limited to the magnitude of the digital input signal).

In some cases, the different connection and switching states may result in slightly different output voltages. By cycling through the different configurations, an average value may be generated for the cycle that is more accurate than any singe value for any single state throughout the cycle.

Figure 7:
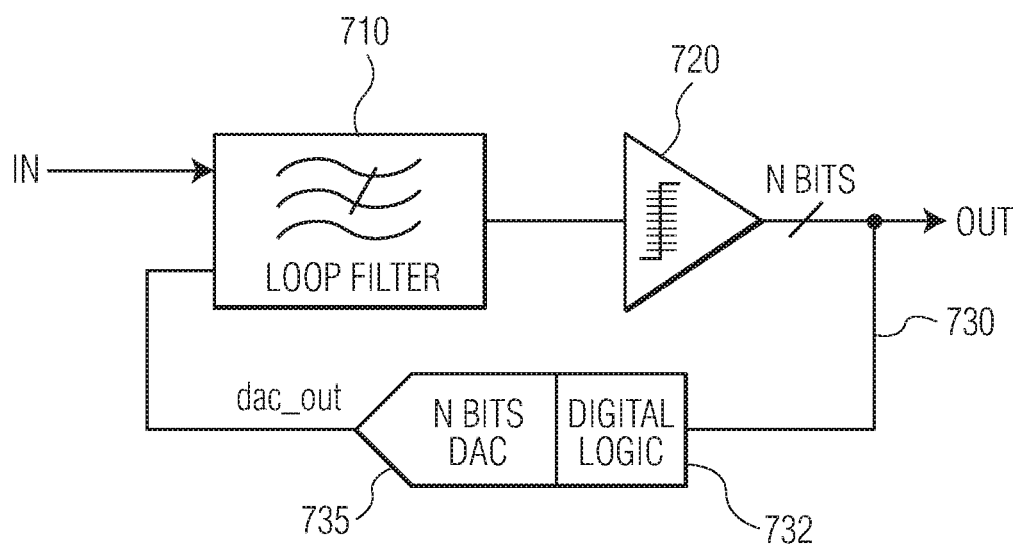
FIG. 7 illustrates an embodiment of a sigma-delta modulator.

FIG. 7 illustrates an example of a sigma-delta modulator implemented to include the signal converter in accordance with the embodiments described herein. Such a modulator may be used in wireless transceivers, as well as other circuits. In this example, a $4^{th}$-order sigma-delta modulator is implemented with a 5-bit feedback signal converter having a bandwidth of 225 kHz and a signal-to-noise distortion ratio of 88 dB. While this type of sigma-delta modulator is one possible application of the signal converter, other embodiments may be directed to other types of sigma-delta modulators or another application where a signal conversion is to be performed.

Referring to FIG. 7, the signal converter includes a loop filter 710, an analog-to-digital quantizer 720, and a feedback loop 730. The loop filter 710 may perform a noise-shaping function on an input analog signal 701 and the resulting signal is input into the analog-to-digital quantizer. Quantizer 720 may be an N-level multi-bit data converter which generates a digital signal which is fed back to the loop filter through feedback loop 730.

The feedback loop may include digital logic 732 in the form of a digital one-hot encoder and a signal converter 735. The one-hot encoder may convert the M-bit digital signal received by the feedback loop 730 into a digital value that has only one high (logical 1) bit and the remaining bits low (logical 0) bits. The digital signal generated by the one-hot encoder is input into the signal converter 735, which may be a digital-to-analog signal converter in accordance with the embodiments described herein. The analog signal DAC_Out generated by signal converter 735 is input into the loop filter. In one embodiment, the amplitude of the digital signal output from the multibit quantizer 720 may be controllable, so that it can be selected on silicon.

In one embodiment, a computer-readable medium stories instructions for generating the switching, connection, and other control signals as described herein. The computer-readable medium may be, for example, any type of read-only or random access memory included, for example, on a same chip or circuit board on which other portions of the signal converter and/or sigma-delta modulator are included.

The instructions stored in the medium (e.g., memory 95) may cause a processor corresponding to the controller 90 to perform the operations of the method embodiments described herein.

In accordance with one or more of the aforementioned embodiments, a signal converter is provided which improves feedback matching in a host circuit. In one embodiment, a matching algorithm is implemented to reduce distortion in the form of N-th even order harmonics, transients, and/or other forms of spurious signals or distortion that degrade performance. Additionally, one or more embodiments may be implemented without using DWA algorithms, excessive numbers of switches, amplifiers, and other features which has been shown to serve as additional sources of noise. As a result, the system and method embodiments described herein may improve the overall operation of their host circuits, for example, by improving signal-to-distortion ratio and lowering power consumption. In one embodiment, the signal converter may be used in a multi-bit sigma-delta modulator.

The controllers, modulators, filters, quantizers, integrators, encoders, selectors, and other signal-generating and signal-processing features of the embodiments disclosed herein may be implemented in logic which, for example, may include hardware, software, or both. When implemented at least partially in hardware, the controllers, modulators, filters, quantizers, integrators, encoders, selectors, and other signal-generating and signal-processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, modulators, filters, quantizers, integrators, encoders, selectors, and other signal-generating and signal-processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A signal converter, comprising:
    a first converter configured to generate a first analog signal from a digital signal;
    a second converter configured to generate a second analog signal from the digital signal;
    a signal generator configured to output a converted analog signal based on the first analog signal and the second analog signal; and
    a controller configured to generate one or more control signals to change a power supply state of at least one of the first converter and the second converter, the change in power supply state to suppress harmonics in the converted analog signal.

2. The signal converter of claim 1, wherein the one or more control signals are to flip the power supply state of at least one of the first converter and the second converter in order to suppress generation of the harmonics.

3. The signal converter of claim 1, wherein the one or more control signals are to change the power supply states of the first and second converters in different periods.

4. The signal converter of claim 2, wherein the signal generator includes:
    a selector coupled between the output node and the first and second converters,
    wherein the controller is to generate one or more third control signals to control selection states of the selector in synchronism with the changed power supply states of the first converter and the second converter in the different periods.

5. The signal converter of claim 4, wherein
    the first converter is selected and the second converter is not selected in a first selection state, and
    the first converter is not selected and the second converter is selected in a second selection state.

6. The signal converter of claim 5, wherein the one or more control signals flip the power supply state of the second converter in the first selection state and flip the power supply state of the first converter in the second selection state.

7. The signal converter of claim 1, wherein
    the first signal converter includes a first resistor ladder, and
    the second signal converter includes a second resistor ladder.

8. The signal converter of claim 1, wherein the controller is configured to:
    compare an amplitude of the digital signal with a predetermined value, and
    generate the one or more control signals to change the power supply state of at least one of the first converter and the second converter based on a result of the comparison.

9. The signal converter of claim 1, wherein the signal generator is to output the converted analog signal when the amplitude of the digital signal is greater than the predetermined value.

10. The signal converter of claim 9, wherein the predetermined value is based on a predetermined proportion between suppression of distortion and harmonics in the converted analog signal.

11. A signal conversion method, comprising:
    generating a first analog signal from a digital signal;
    generating a second analog signal from the digital signal;
    outputting a converted analog signal based on the first and second analog signals; and
    controlling generation of one or more control signals to change a power supply state of at least one of the first converter and the second converter in order to suppress harmonics in the converted analog signal.

12. The method of claim 11, wherein the one or more control signals flip the power supply state of at least one of the first converter and the second converter in order to suppress generation of the harmonics.

13. The method of claim 11, wherein the one or more control signals are to change the power supply states of the first and second converters in different periods.

14. The method of claim 12, wherein outputting the converted analog signal includes:
    generating one or more third control signals to control selection states of a selector coupled between the output node and the first and second converters, the selection states controlled in synchronism with the changed power supply states of the first converter and the second converter in the different periods.

15. The method of claim 14, wherein:
    the first analog signal is generated by a first converter, and the second analog signal is generated by a second converter.

16. The method of claim 15, wherein:
    the first converter is selected and the second converter is not selected in a first selection state, and
    the first converter is not selected and the second converter is selected in a second selection state.

17. The method of claim 16, wherein the one or more control signals flip the power supply state of the second converter in the first selection state and flip the power supply state of the first converter in the second selection state.

18. The method of claim 11, further comprising:
    comparing an amplitude of the digital signal with a predetermined value, and generating the one or more control signals to change the power supply state of at least one of the first converter and the second converter based on a result of the comparison.

19. The method of claim 18, wherein output the converted analog signal is performed when the amplitude of the digital signal is greater than the predetermined value.

20. The method of claim 19, wherein the predetermined value is based on a predetermined proportion between suppression of distortion and harmonics in the converted analog signal.

* * * * *